(12) United States Patent
Feng

(10) Patent No.: US 11,568,767 B2
(45) Date of Patent: Jan. 31, 2023

(54) FOLDABLE DISPLAY DEVICE AND MANUFACTURING METHOD THEREOF

(71) Applicant: Wuhan China Star Optoelectronics Semiconductor Display Technology Co., Ltd., Wuhan (CN)

(72) Inventor: Zikang Feng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 252 days.

(21) Appl. No.: 16/959,147

(22) PCT Filed: Mar. 18, 2020

(86) PCT No.: PCT/CN2020/079967
§ 371 (c)(1),
(2) Date: Jun. 30, 2020

(87) PCT Pub. No.: WO2021/134922
PCT Pub. Date: Jul. 8, 2021

(65) Prior Publication Data
US 2022/0005385 A1    Jan. 6, 2022

(30) Foreign Application Priority Data
Jan. 3, 2020   (CN) .......................... 202010006777.4

(51) Int. Cl.
*H01L 27/32*   (2006.01)
*H01L 51/52*   (2006.01)
*G09F 9/30*    (2006.01)
*H01L 51/56*   (2006.01)

(52) U.S. Cl.
CPC ............ *G09F 9/301* (2013.01); *H01L 27/323* (2013.01); *H01L 51/5293* (2013.01); *H01L 51/56* (2013.01); *H01L 2251/5338* (2013.01)

(58) Field of Classification Search
CPC ......... G09F 9/301; G09F 9/33; H01L 27/323; H01L 51/5293; H01L 51/56; H01L 2251/5338
See application file for complete search history.

(56) References Cited

U.S. PATENT DOCUMENTS

| | | | |
|---|---|---|---|
| 2015/0146349 A1 | 5/2015 | Choi et al. | |
| 2017/0199547 A1* | 7/2017 | Jeong | G06F 1/1652 |
| 2019/0107866 A1 | 4/2019 | Han et al. | |
| 2019/0384363 A1 | 12/2019 | Lee | |
| 2019/0386089 A1 | 12/2019 | Hsu et al. | |

(Continued)

FOREIGN PATENT DOCUMENTS

| | | |
|---|---|---|
| CN | 106847099 | 6/2017 |
| CN | 106960634 | 7/2017 |
| CN | 107113926 | 8/2017 |

(Continued)

*Primary Examiner* — Kyoung Lee
(74) *Attorney, Agent, or Firm* — PV IP PC; Wei Te Chung; Ude Lu

(57) ABSTRACT

A foldable display device and a method of manufacturing the same are disclosed. The foldable display device includes a flexible display panel. When the flexible display panel is in a first pre-folded state, part of the flexible display panel corresponding to a folding area is under a stress less than or equal to a first predetermined threshold.

18 Claims, 13 Drawing Sheets

(56) References Cited

U.S. PATENT DOCUMENTS

2021/0407339 A1* 12/2021 Feng .................... B32B 37/182

FOREIGN PATENT DOCUMENTS

| | | |
|---|---|---|
| CN | 108773142 | 11/2018 |
| CN | 109300405 | 2/2019 |
| CN | 109461385 | 3/2019 |
| CN | 109994044 | 7/2019 |
| CN | 110148358 | 8/2019 |
| CN | 110570762 | 12/2019 |
| CN | 110610658 | 12/2019 |
| CN | 111105715 | 5/2020 |
| CN | 109360498 | 9/2020 |

* cited by examiner

FOLDABLE DISPLAY DEVICE AND MANUFACTURING METHOD THEREOF

RELATED APPLICATIONS

This application is a National Phase of PCT Patent Application No. PCT/CN2020/079967 having International filing date of Mach 18, 2020, which claims the benefit of priority of Chinese Patent Application No. 202010006777.4 filed on Jan. 3, 2020. The contents of the above applications are all incorporated by reference as if fully set forth herein in their entirety.

FIELD AND BACKGROUND OF THE INVENTION

The present invention relates to a technical field of displays, and particularly to, a foldable display device and a method of manufacturing the same.

Flexible organic light-emitting diode (OLED) display panels have gained wide attention due to their bendable characteristics, and one of the most major uses of flexible OLED display panels is to be applied to foldable display devices.

Currently, when flexible OLED display panels are used in foldable display devices, a relatively large amount of deformation occurred in part of the flexible OLED display panels corresponding to bent areas of the foldable display devices because the flexible OLED display panels are bent frequently or are kept in a bent state for a long term when used in the foldable display devices. The relatively large amount of deformation puts flexible OLED display panels at risk of breakage.

Therefore, it is imperative to provide a technical solution to solve the problem that flexible OLED display panels are put at risk of breakage due to a large amount of deformation occurred in folding foldable display devices.

SUMMARY OF THE INVENTION

An object of the present invention is to provide a foldable display device and a method of manufacturing the same to solve the problem that flexible organic light-emitting diode (OLED) display panels are put at risk of breakage due to a large amount of deformation occurred in folding foldable display devices.

To achieve the above-mentioned object, the present application provides a foldable display device, comprising at least a folding area and a plurality of non-folding areas disposed on and adjoining opposite two sides of the at least a folding area; a flexible display panel provided in a first pre-folded state, wherein when the flexible display panel is in the first pre-folded state, part of the flexible display panel corresponding to the folding area is under a stress less than or equal to a first predetermined threshold, wherein part of the flexible display panel corresponding to the non-folding areas located on the opposite two sides of the folding area is disposed at an angle greater than zero degree and less than 180 degrees with respect to each other.

In the foldable display device, the first predetermined threshold ranges between 8 megapascals (MPa) and 12 MPa.

In the foldable display device, when the flexible display panel is in the first pre-folded state, the part of the flexible display panel corresponding to the folding area is under a stress equal to 0 MPa.

In the foldable display device, when the flexible display panel is in the first pre-folded state, the part of the flexible display panel corresponding to the non-folding areas located on the opposite two sides of the folding area is disposed at an angle greater than or equal to 10 degrees and less than or equal to 170 degrees with respect to each other.

In the foldable display device, when the flexible display panel is in the first pre-folded state, the part of the flexible display panel corresponding to the non-folding areas located on the opposite two sides of the folding area is disposed at an angle greater than or equal to 60 degrees and less than or equal to 120 degrees with respect to each other.

In the foldable display device, when the flexible display panel is in the first pre-folded state, the part of the flexible display panel corresponding to the non-folding areas located on the opposite two sides of the folding area is disposed at an angle equal to 90 degrees with respect to each other.

In the foldable display device, the flexible display panel comprises a plurality of first pixels disposed corresponding to position of the folding area, and a plurality of second pixels disposed corresponding to position of the non-folding areas; wherein when the flexible display panel is in the first pre-folded state, adjacent two of the first pixels are spaced apart at a distance different from a distance between adjacent two of the second pixels; wherein when the flexible display panel is in a fully expanded state, adjacent two of the first pixels are spaced apart at a distance equal to a distance between adjacent two of the second pixels.

In the foldable display device, the foldable display device is an inward-folded display device, and when the flexible display panel is in the first pre-folded state, adjacent two of the first pixels are spaced apart at a distance less than a distance between adjacent two of the second pixels.

In the foldable display device, the foldable display device is an outward-folded display device, and when the flexible display panel is in the first pre-folded state, adjacent two of the first pixels are spaced apart at a distance greater than a distance between adjacent two of the second pixels.

In the foldable display device, the foldable display device further comprises a functional layer, wherein the functional layer is provided in a second pre-folded state, and when the functional layer is in the second pre-folded state, part of the functional layer corresponding to the non-folding areas located on the opposite two sides of the folding area is disposed at an angle greater than zero degree and less than 180 degrees with respect to each other, wherein the part of the functional layer corresponding to the folding area is under a stress less than or equal to a second predetermined threshold.

In the foldable display device, the second predetermined threshold ranges between 0.8 MPa and 11 MPa, and the functional layer comprises at least one of a rear cover, a protection cover, a polarizer, a rigid support layer, and a touch layer.

In the foldable display device, the functional layer is a touch layer, and the touch layer comprises a plurality of first touch units corresponding to position of the folding area, and a plurality of second touch units corresponding to position of the non-folding areas; wherein when the touch layer is in the second pre-folded state, adjacent two of the first touch units are spaced apart at a distance different from a distance between adjacent two of the second touch units; wherein when the touch layer is in a fully expanded state, adjacent two of the first touch units are spaced apart at a distance equal to a distance between adjacent two of the second touch units.

In the foldable display device, when the flexible display panel is in the first pre-folded state, the part of the flexible display panel corresponding to the folding area has a circular arc shape or an oval arc shape, or when the flexible display panel is in the first pre-folded state, the part of the flexible display panel corresponding to the folding area has a drip-like curve shape, wherein the drip-like curve shape has an inward-bent curved segment and two outward-bent curved segments connected to two ends of the inward-bent curved segment, wherein part of the flexible display panel having the outward-bent curved segments are connected between the part of the flexible display panel corresponding to the non-folding areas and part of the flexible display panel having the inward-bent curved segment.

A method of manufacturing a foldable display device, comprising providing a jig, the jig comprising a first inclined surface, a second inclined surface, and a curved surface connecting the first inclined surface and the second inclined surface, wherein the first inclined surface and the second inclined surface are disposed at an angle greater than zero degree and less than 180 degrees with respect to each other; forming a flexible substrate on the first inclined surface, the second inclined surface, and the curved surface of the jig, such that the flexible substrate is in a pre-folded state; and obtaining, by forming a light-emitting device layer on a surface of the flexible substrate in the pre-folded state away from the jig, a flexible display panel in the pre-folded state; wherein the flexible display panel in the pre-folded state comprises a bending portion under a stress less than or equal to a first predetermined threshold.

In the method of manufacturing the foldable display device, the foldable display device further comprises forming a functional layer in a pre-folded state on the first inclined surface, the second inclined surface, and the curved surface of the jig, wherein the functional layer in the pre-folded state comprises a bending portion under a stress less than or equal to a second predetermined threshold.

In the method of manufacturing the foldable display device, the method further comprises placing one of the flexible display panel in the pre-folded state and the functional layer in the pre-folded state on the first inclined surface, the second inclined surface, and the curved surface of the jig; forming an adhesive layer away from the jig on a surface of the flexible display panel in the pre-folded state or on a surface of the functional layer in the pre-folded state whichever is placed on the jig; and laminating one of the flexible display panel in the pre-folded state or the functional layer in the pre-folded state whichever is not placed on the jig to the adhesive layer so that the foldable display device is obtained.

In the method of manufacturing the foldable display device, the method further comprises fully expanding the flexible display panel in the pre-folded state and the functional layer in the pre-folded state, so that the flexible display panel in a fully expanded state and the functional layer in a fully expanded state are obtained; forming an adhesive layer on a surface of one of the flexible display panel in the fully expanded state or on a surface of the functional layer in the fully expanded state; and laminating one of the flexible display panel in the fully expanded state or the functional layer in the fully expanded state whichever is in exclusion of the adhesive layer to the adhesive layer, so that the foldable display device in the fully expanded state is obtained.

In the method of manufacturing the foldable display device, the functional layer comprises at least one of a rear cover, a protection cover, a polarizer, a rigid support layer, and a touch layer.

In the method of manufacturing the foldable display device, the first predetermined threshold ranges between 8 MPa and 12 MPa, and the second predetermined threshold ranges between 0.8 MPa and 11 MPa.

In the method of manufacturing the foldable display device, the angle formed by the first inclined surface and the second inclined surface is equal to 90 degrees, and the bending portion of the flexible display panel in the pre-folded state is under a stress equal to 0 Mpa.

The present application provides a foldable display device and a method of manufacturing the same. The foldable display device comprising at least a folding area and a plurality of non-folding areas disposed on and adjoining opposite two sides of the at least a folding area; a flexible display panel provided in a first pre-folded state, wherein when the flexible display panel is in the first pre-folded state, part of the flexible display panel corresponding to the folding area is under a stress less than or equal to a first predetermined threshold, wherein part of the flexible display panel corresponding to the non-folding areas located on the opposite two sides of the folding area is disposed at an angle greater than zero degree and less than 180 degrees with respect to each other. Compared with the prior art, a large amount of deformation is produced when traditional flexible display panels deform from a fully expanded state without stress (tensile stress and compressive stress) to a folded up state, so that the traditional flexible display panels are put at risk of breakage. Based on a foldable display device of the present application, part of the flexible display panel corresponding to a folding area is under a stress less than or equal to a first predetermined threshold, so that the part of the flexible display panel corresponding to the folding area under the stress less than or equal to the first predetermined threshold produces a zero amount of deformation. When the foldable display device deforms from the first pre-folded state to the folded up state, angle variation of the flexible display panel in bending becomes less, the flexible display panel in the folded up state is correspondingly under a less stress, and a maximum deformation amount of the flexible display panel in the folded up state is reduced, thereby reducing a risk of breakage of the flexible display panel of the foldable display device in repeated bending and expanding, and improving bending performance of the foldable display device.

DESCRIPTION OF SPECIFIC EMBODIMENTS OF THE INVENTION

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments obtained by those skilled in the art without creative efforts shall be within the scope of the present application.

Figure 1A:
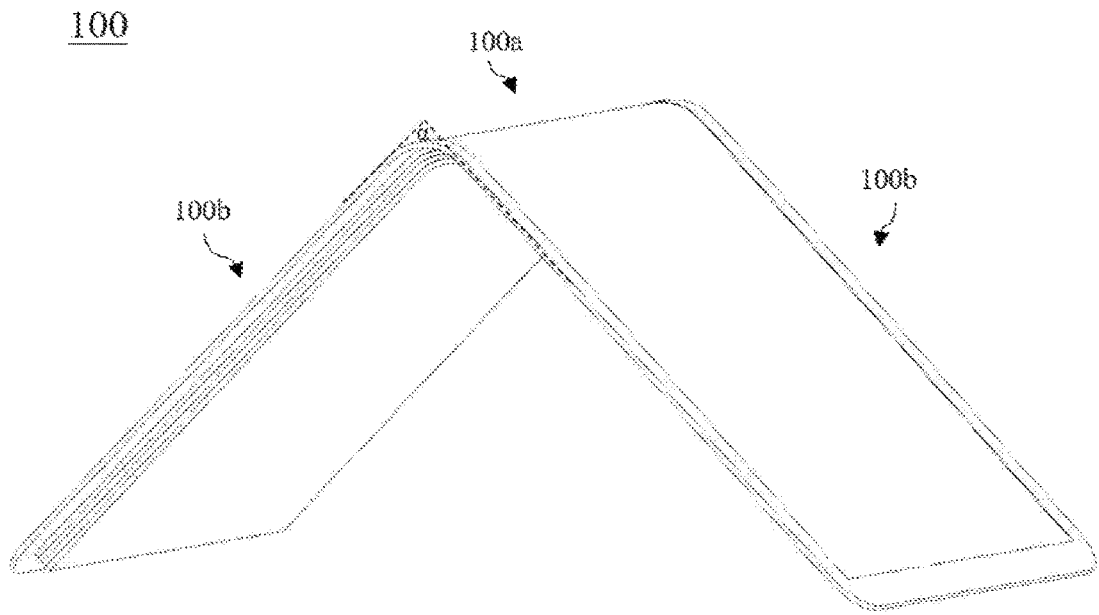
FIG. 1A is a schematic perspective view of a foldable display device embodied as an outward-folded display device in a pre-folded state in accordance with an embodiment of the present application.

Please refer to FIG. 1A showing a schematic perspective view of a foldable display device embodied as an outward-folded display device in a pre-folded state in accordance with an embodiment of the present application. A foldable display device 100 is a flexible foldable display device. The foldable display device 100 includes at least a folding area 100a and a plurality of non-folding areas 100b disposed on and adjoining opposite two sides of the at least a folding area 100a. The folding area 100a and the two non-folding areas 100b of the foldable display device 100 are configured to display images.

The foldable display device 100 is provided in a pre-folded state. As shown in FIG. 1A, when the foldable display device 100 is in the pre-folded state, part of the foldable display device 100 corresponding to the two non-folding areas 100b located on the opposite two sides of the folding area 100a is disposed at an angle α greater than zero degree and less than 180 degrees with respect to each other. The part of the foldable display device 100 corresponding to the two non-folding areas 100b is planar in shape. Part of the foldable display device 100 corresponding to the folding area 100a is circularly curved in shape. The circularly curved shape of the part of foldable display device 100 corresponding to the folding area 100a enables the part of the foldable display device 100 corresponding to the folding area 100a in the pre-folded state to have same curvature everywhere.

By bending the part of the foldable display device 100 corresponding to the folding area 100a, the foldable display device 100 is capable of deforming from the pre-folded state to a fully expanded state, a folded up state, an intermediate state transitioning from the fully expanded state to the pre-folded state, or an intermediate state transitioning from the pre-folded state to the fully expanded state.

Figure 1B:
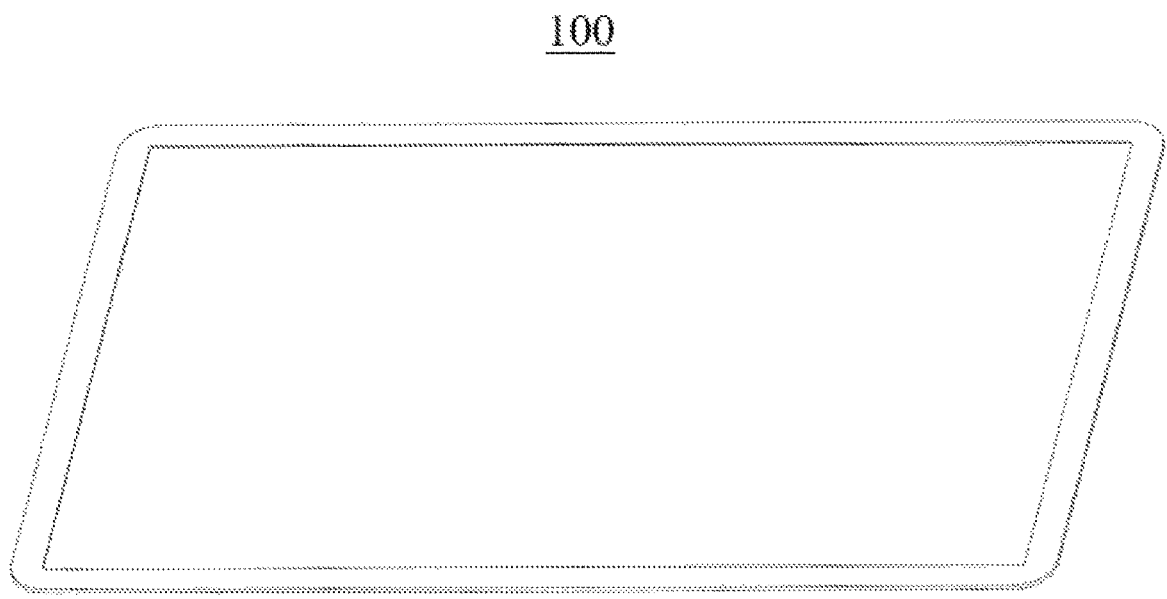
FIG. 1B is a schematic perspective view showing the foldable display device of FIG. 1A in a fully expanded state.

Please refer to FIG. 1B which is a schematic perspective view showing the foldable display device of FIG. 1A in a fully expanded state. When the foldable display device 100 deforms from the pre-folded state to the fully expanded state, the angle α formed by the part of the foldable display device 100 corresponding to the two non-folding areas 100b located on the opposite two sides of the folding area 100a gradually increases to 180 degrees.

Figure 1C:
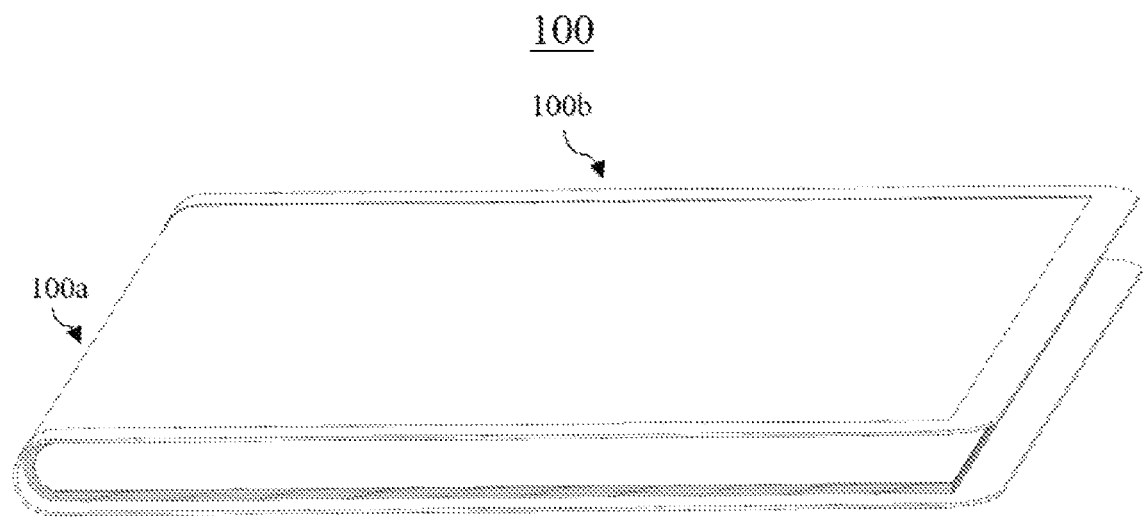
FIG. 1C is a schematic perspective view showing the foldable display device of FIG. 1A in a folded up state.

Please refer to FIG. 1C showing a schematic perspective view of the foldable display device of FIG. 1A in the folded up state. The foldable display device shown in FIG. 1C is embodied as an outward-folded display device. After the foldable display device 100 shown in FIG. 1C is completely folded, the foldable display device 100 has a U-like shape as a whole, and display surfaces disposed on the foldable display device 100 corresponding to the opposite two sides of the folding area 100a are facing away from each other. When the foldable display device 100 deforms from the pre-folded state to the folded up state, the angle α formed by the part of the foldable display device 100 corresponding to the two non-folding areas 100b located on the opposite two sides of the folding area 100a gradually decreases to zero degree.

Figure 1D:
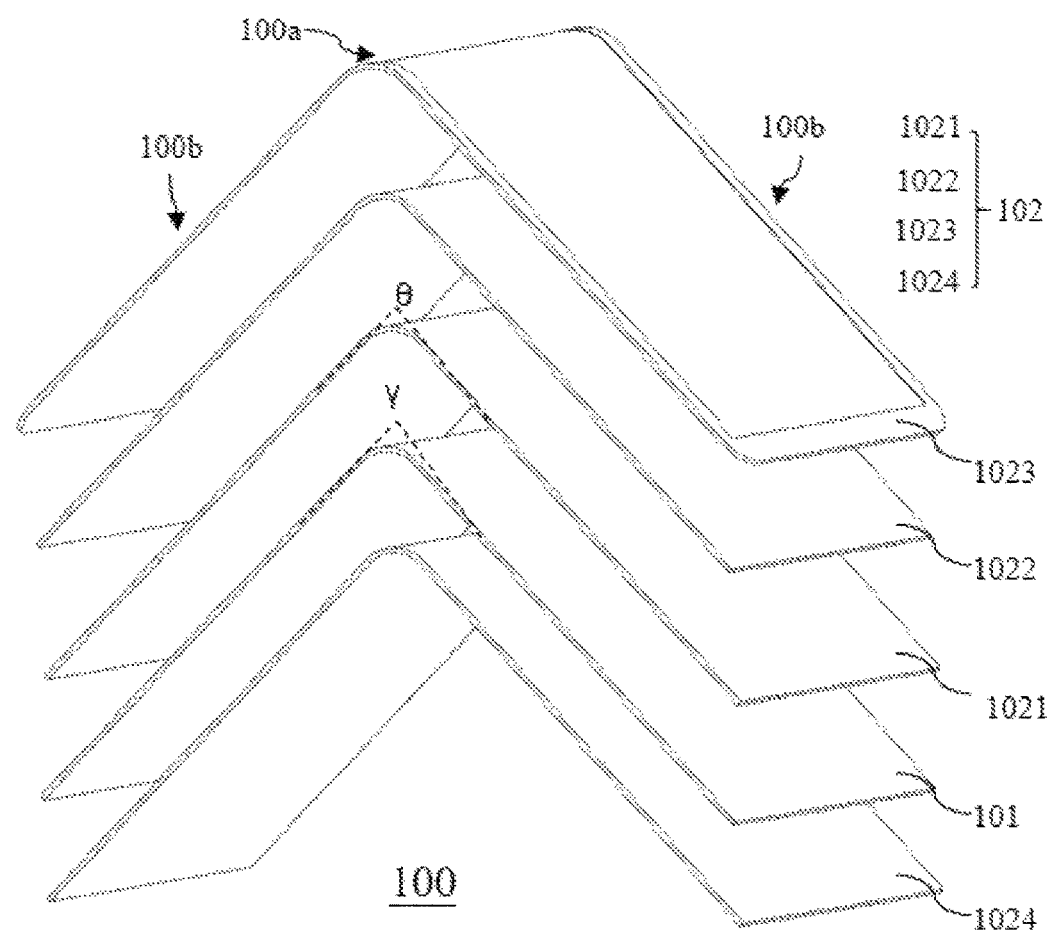
FIG. 1D is a schematic exploded view of the foldable display device of FIG. 1A in a pre-folded state.
Figure 1E:
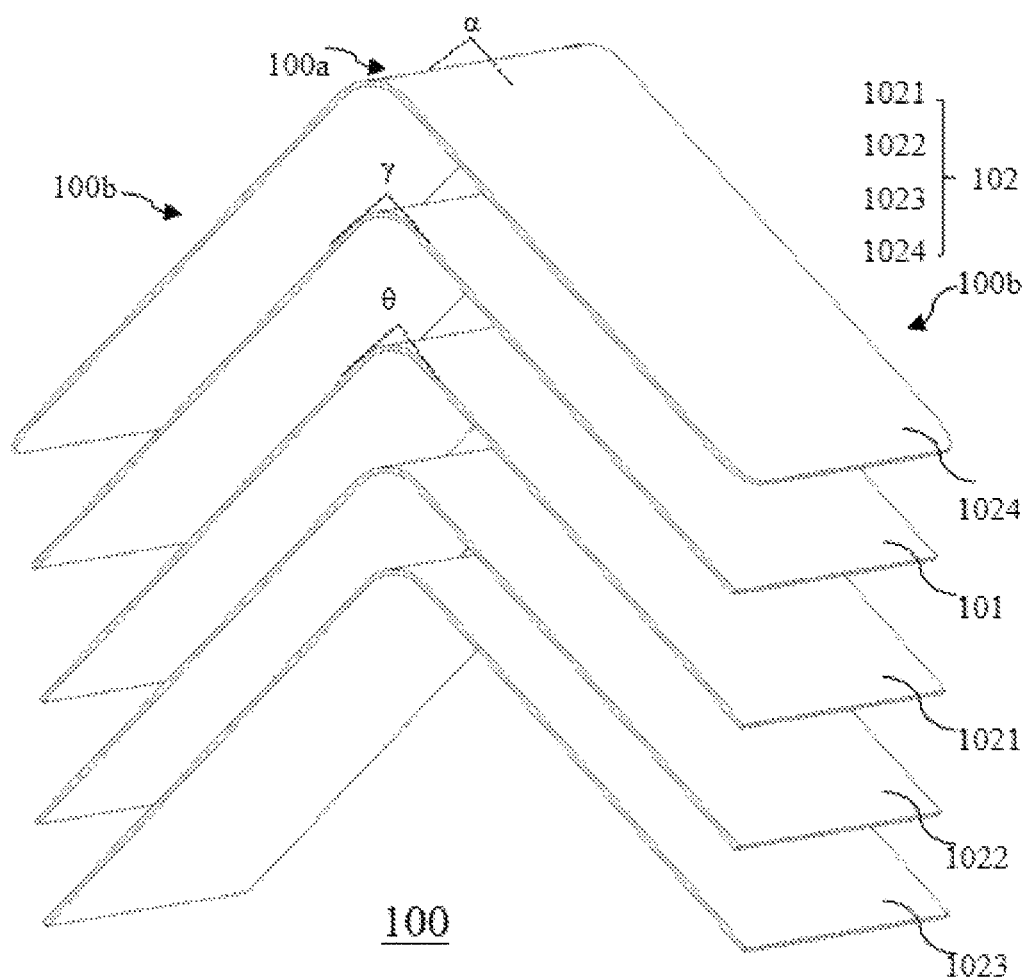
FIG. 1E is a schematic exploded view of a foldable display device embodied as an inward-folded display device in the pre-folded state in accordance with an embodiment of the present application.
Figure 1F:
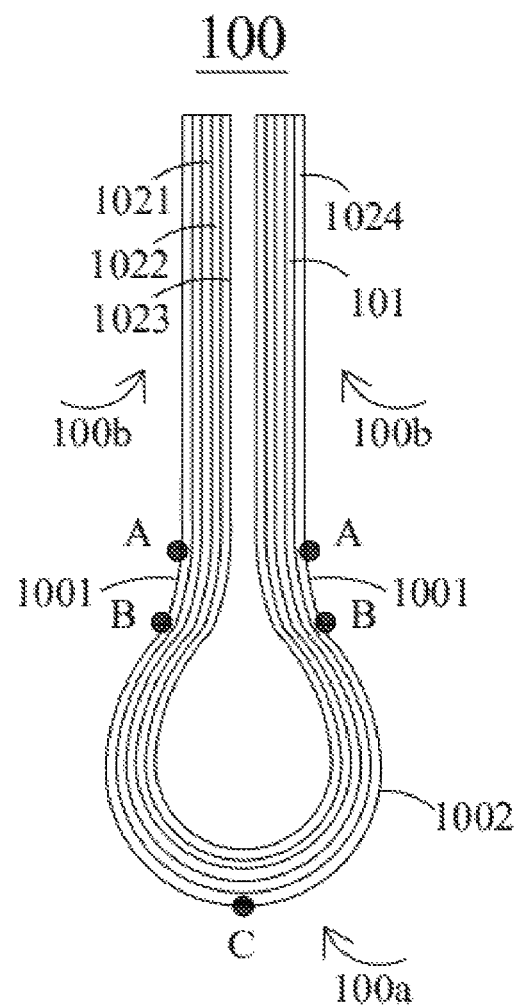
FIG. 1F is a schematic view showing the foldable display device of FIG. 1E in the folded up state.

Please refer to FIGS. 1E and 1F. FIG. 1E is a schematic exploded view of a foldable display device embodied as an inward-folded display device in the pre-folded state. FIG. 1F is a schematic view showing the foldable display device of FIG. 1E in the folded up state. When the foldable display device as shown in FIG. 1E is embodied as the inward-folded display device in the pre-folded state, the angle α formed by the part of the foldable display device 100 corresponding to the two non-folding areas 100b located on the opposite two sides of the folding area 100a is greater than zero degree and less than 180 degrees. FIG. 1F shows that after the foldable display device folds up, the part of the foldable display device corresponding to the folding area 100a has a drip-like curve shape, and display surfaces disposed on the foldable display device 100 corresponding to the opposite two sides of the folding area 100a are parallel with each other. Specifically, the drip-like curve shape has an inward-bent curved segment 1002 and two outward-bent curved segments 1001 connected to two ends of the inward-bent curved segment 1002. Part of the foldable display device 100 having the outward-bent curved segments 1001 are disposed between the part of the foldable display device 100 corresponding to the non-folding areas 100b and the part of the foldable display device having the inward-bent curved segment 1002. Each of the outward-bent curved segments 1001 starts at a first point A and ends at a second point B with the inward-bent curved segment 1002. A third point C is defined as a point having a maximum curvature on the inward-bent curved segment 1002. The first point A on each of the outward-bent segments 1001 has zero curvature. Curvature of each point on each of the outward-bent segments 1001 increase first from the first point A and gradually decreases till the second point B. Curvature of each point on the inward-bent curved segment 1002 gradually increases from the second point B to the third point C, wherein a film layer provided with the third point C is configured with a radius ranging between 0.5 millimeters (mm) and 5 mm. For example, the third point C is corresponding to a radius of 1 mm, 2.5 mm, or 4 mm.

In the present embodiment, the folding area 100*a* of the foldable display device 100 has a width between 3 mm and 300 mm. For example, a width of the folding area 100*a* of the foldable display device 100 may be 20 mm, 50 mm, 100 mm, 200 mm, and 250 mm.

Please refer to FIGS. 1D and 1E. FIG. 1D is a schematic exploded view of the foldable display device of FIG. 1A in the pre-folded state. The foldable display device 100 includes a flexible display panel 101 and a functional layer 102.

The flexible display panel 101 is provided for image display. The flexible display panel 101 is a flexible organic light-emitting diode display panel. The flexible display panel 101 may be a top-emission type organic light-emitting diode display panel, or may be a bottom-emission type organic light-emitting diode display panel. The flexible display panel 101 includes a flexible substrate, a thin-film transistor array layer, a light-emitting device layer, and a thin-film encapsulation layer that are sequentially disposed in a stack arrangement.

The flexible substrate is used as a carrier to support the thin-film transistor array and the light-emitting device layer, etc., while making the flexible display panel have good bendability. The flexible substrate is a transparent polyimide layer. The thin-film transistor array layer includes multiple thin-film transistors arranged in an array. Thin-film transistors function as a switch to control the organic light-emitting diode in the light-emitting device layer to emit light. The light-emitting device layer is used to emit light to display images. The light-emitting device layer includes a plurality of organic light-emitting diodes arranged in an array. The organic light-emitting diodes arranged in an array may include red organic light-emitting diodes, blue organic light-emitting diodes, and green organic light-emitting diodes. The organic light-emitting diodes arranged in an array may include white organic light-emitting diodes. Each of the organic light-emitting diode includes an anode, a cathode, and an organic light-emitting layer between the anode and the cathode. The thin-film encapsulation layer is configured to encapsulate the light-emitting device layer to prevent the cathode and the organic light-emitting layer in the light-emitting device layer from being corroded by water vapor and oxygen. The thin-film encapsulation layer includes two inorganic layers and an organic layer between the two inorganic layers.

The flexible display panel 101 is provided in a first pre-folded state. In this embodiment, the flexible display panel 101 is in the first pre-folded state in conjunction with the foldable display in the pre-folded state. As shown in FIGS. 1D and 1E, when the flexible display panel 101 is in the first pre-folded state, part of the flexible display panel 101 corresponding to the two non-folding areas 100*b* located on the opposite two sides of the folding area 100*a* is disposed at an angle γ greater than zero degree and less than 180 degrees with respect to each other. For example, the angle γ is 5 degrees or 175 degrees. The angle γ formed by the part of the flexible display panel 101 in the first pre-folded state corresponding to the two non-folding areas 100*b* located on the opposite two sides of the folding area 100*a* is the same as the angle α formed by the part of the foldable display device 100 in the pre-folded state corresponding to the two non-folding areas 100*b* located on the opposite two sides of the folding area 100*a*. When the flexible display panel 101 is in the first pre-folded state, part of the flexible display panel 101 corresponding to the folding area 100*a* is under a stress less than or equal to a first predetermined threshold. An amount of deformation of the flexible display panel 101 is zero when the part of the flexible display panel 101 corresponding to the folding area 100*a* is under the stress less than or equal to the first predetermined threshold. It should be noted that throughout this application, "the amount of deformation is zero" means that the amount of deformation in the macro sense is zero, and the amount of deformation in the macro meaning is zero means that the amount of deformation recognized by the human eye is zero.

In this embodiment, whatever the foldable display device is an outward-bent display device or an inward-bent display device, when the foldable display device 100 deforms from the pre-folded state to the fully expanded state, a bending angle of the foldable display device 100 is between 180 degrees and an angle α. In doing so, when the flexible display panel 101 deforms from the first pre-folded state to the fully expanded state, the flexible display panel 101 also has a bending angle between 180 degrees and an angle α. The flexible display panel 101 in the fully expanded state has an amount of deformation greater than zero. When the foldable display device deforms from the pre-folded state to the fully expanded state, the foldable display device has a bending angle α. In doing so, when the flexible display panel 101 deforms from the first pre-folded state to the fully expanded state, the flexible display panel has the bending angle α. An amount of deformation of the flexible display panel in a folded up state is zero. Since the angle α ranges between zero and 180 degrees, an angle between 180−α and α are greater than zero and less than 180. In comparison with prior art, the foldable display device in the fully expanded state is under a stress (including tensile stress and compressive stress) of zero megapascal (Mpa). Film layers consisting of the foldable display device each have zero amount of deformation. In order to transition the foldable display device from the fully expanded state to the folded up state, the foldable display device needs to be bent at 180 degrees, and the flexible display panel also needs to be bent at 180 degrees, wherein the amount of deformation of the flexible display panel is greater than that of the foldable display device. In a process of bending the foldable display device 100, the flexible display panel 101 of the present application bends at an angle less than a maximum bending angle (one of an angle between 180 degrees−α and the angle α) of the foldable display device, so that a maximum tensile stress and a maximum compressive stress applied to the flexible display panel 101 during the bending process are less than a maximum tensile stress and a maximum compressive stress applied to traditional flexible display panels in bending, thereby enabling a less amount of maximum tensile deformation and a less amount of maximum compression deformation of the flexible display panel 101 of the foldable display device 100 during the bending process, so that the flexible display panel 101 is prevented from breaking during repeated folding, and bending resistance performance of the flexible display panel 101 is improved.

Furthermore, when the foldable display device 100 is in the pre-folded state, the part of the foldable display device corresponding to the two non-folding areas 100b located on the opposite two sides of the folding area 100a is disposed at an angle α greater than or equal to 10 degrees and less than or equal to 170 degrees with respect to each other. In doing so, when the flexible display panel 101 is in the first pre-folded state, the part of the flexible display panel corresponding to the two non-folding areas 100b located on the opposite two sides of the folding area 100a is disposed at an angle γ greater than or equal to 10 degrees and less than or equal to 170 degrees with respect to each other. For example, the angle γ is 10 degrees, 30 degrees, 150 degrees, or 170 degrees, so that the flexible display panel 101 is prevented from being broken during repeated folding, and bending resistance performance of the flexible display panel 101 is improved.

Still further, when the foldable display device 100 is in the pre-folded state, the part of the foldable display device 100 corresponding to the two non-folding areas 100b located on the opposite two sides of the folding area 100a is disposed at an angle α greater than or equal to 60 degrees and less than or equal to 120 degrees with respect to each other. In doing so, when the flexible display panel 101 is in the first pre-folded state, the part of the flexible display panel 101 corresponding to the two non-folding areas 100b located on the opposite two sides of the folding area 100a is disposed at an angle γ greater than or equal to 60 degrees and less than or equal to 120 degrees with respect to each other. For example, the angle γ is 60 degrees, 70 degrees, 80 degrees, 100 degrees, 110 degrees, or 120 degrees, so that the flexible display panel 101 is prevented from breaking during repeated folding, and bending resistance performance of the flexible display panel 101 is improved.

Specifically, when the foldable display device 100 is in the pre-folded state, the part of the foldable display device 100 corresponding to the two non-folding areas 100b located on the opposite two sides of the folding area 100a is disposed at an angle α equal to 90 degrees with respect to each other. In doing so, when the flexible display panel 101 is in the pre-folded state, the part of the flexible display panel 101 corresponding to the two non-folding areas 100b located on the opposite two sides of the folding area 100a is disposed at an angle γ equal to 90 degrees with respect to each other. In this manner, the foldable display device 100 bends at an angle of 90 degrees when deforming from the pre-folded state to the fully expanded state or deforming from the pre-folded state to the folded up state, so that an amount of deformation of the flexible display panel 101 becomes less when deforming from the first pre-folded state at a zero amount of deformation to the folded up state or to the fully expanded state, thereby avoiding a risk of failure of the flexible display panel 101 caused by an excessive amount of deformation of the part of the flexible display panel 101 corresponding to the folding area 100a.

Based on a large number of simulation tests and experimental tests, the inventor found that a value range of the first predetermined threshold is between 8 MPa and 12 MPa, thereby assuring that an amount of deformation of the part of the flexible display panel 101 corresponding to the folding area 100a is zero when the foldable display device 100 is in the pre-folded state along with the flexible display panel 101 in the first pre-folded state. Specifically, the first predetermined threshold is 10 MPa. When the flexible display panel 101 is in the first pre-folded state, the part of the flexible display panel 101 corresponding to the folding area 100a is under a stress of 0 Mpa, thereby enabling a zero amount of deformation of the part of the flexible display panel 101 corresponding to the folding area 100a.

The flexible display panel 101 includes a plurality of first pixels 1011 disposed corresponding to position of the folding area 100a, and a plurality of second pixels 1012 disposed corresponding to position of the non-folding areas 100b. When the foldable display device 100 is in the folded state, the flexible display panel 101 is correspondingly in the first pre-folded state, and adjacent two of the first pixels 1011 are spaced apart at a distance different from a distance between adjacent two of the second pixels 1012. When the foldable display device 100 is in the fully expanded state, the flexible display panel 101 is correspondingly in the fully expanded state, and adjacent two of the first pixels 1011 are spaced apart at a distance equal to a distance between adjacent two of the second pixels 1012, so that pixel distributions in the folding area 100a and the non-folding areas 100b are uniform when the flexible display panel 101 is displaying, thereby display performance of the foldable display device 100 is uniform.

Figure 2A:
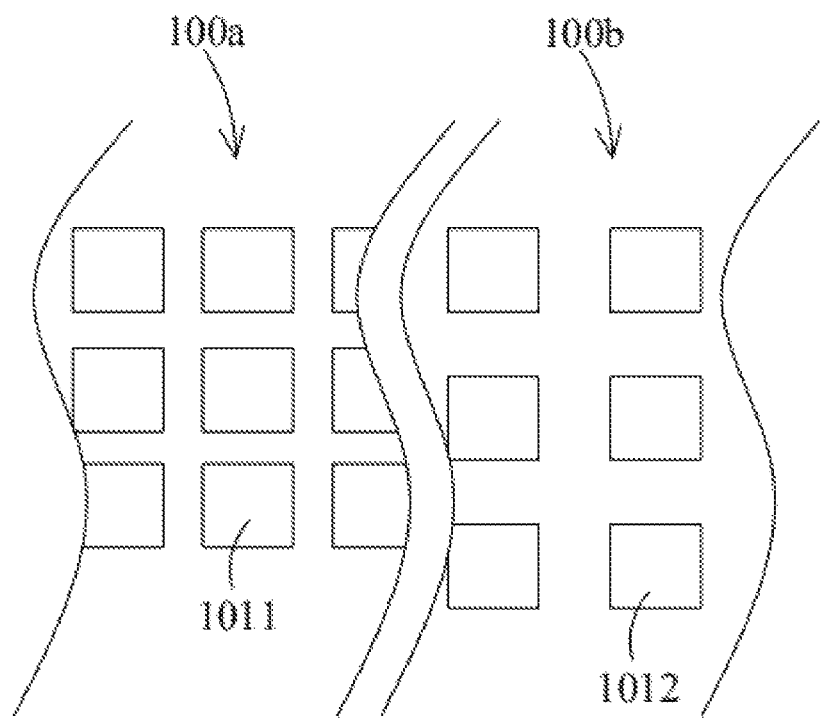
FIG. 2A is a partial schematic view showing a display surface of a flexible display panel of a foldable display device in the pre-folded state, wherein the foldable display device is embodied as an inward-folded display device.
Figure 2B:
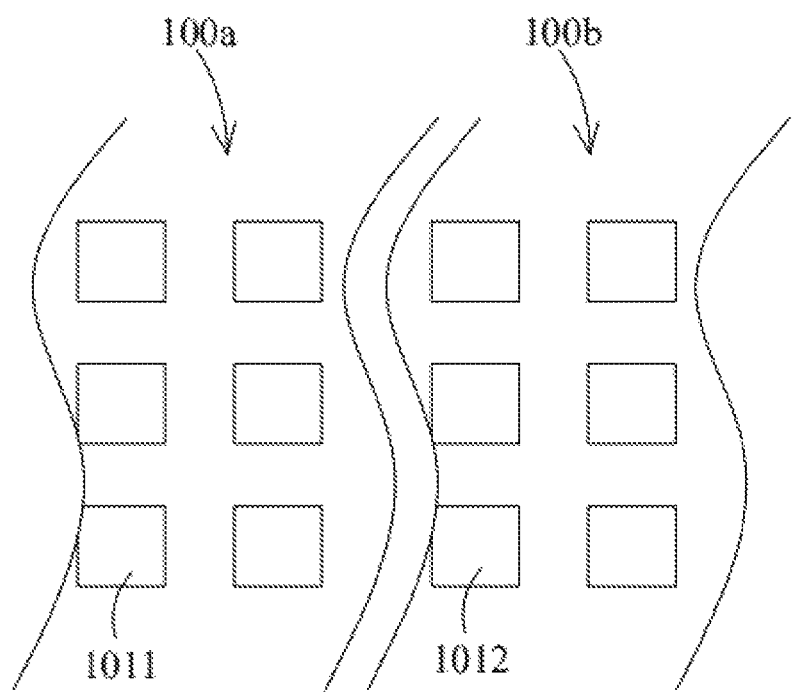
FIG. 2B is a partial schematic view showing the display surface of the flexible display panel of the foldable display device of FIG. 2A in a fully expanded state.

Please refer to FIGS. 2A and 2B. FIG. 2A is a partial schematic view showing a display surface of a flexible display panel of a foldable display device in a pre-folded state, wherein the foldable display device is embodied as an inward-folded display device. FIG. 2B is a partial schematic view showing the display surface of the flexible display panel of the foldable display device of FIG. 2A in a fully expanded state. When the foldable display device 100 is an inward-folded display device in the pre-folded state, the flexible display panel 101 is correspondingly in the first pre-folded state, and adjacent two of the first pixels 1011 are spaced apart at a distance less than a distance between adjacent two of the second pixels 1012. When the foldable display device 100 deforms from the pre-folded state to the fully expanded state, part of a display surface of the flexible display panel 101 corresponding to the folding area 100a is subjected to tensile stress, wherein a distance between adjacent two of the first pixels 1011 gradually increases, and a distance between adjacent two of the second pixels 1012 remains unchanged. When the flexible display panel 101 is in the fully expanded state, a distance between adjacent two of the first pixels 1011 is the same as a distance between adjacent two of the second pixels 1012.

When the foldable display device 100 is embodied as the inward-folded display device, each of the first pixels 1011 includes at least three first subpixels, and each of the second pixels 1012 includes at least three second subpixels. The first subpixels each have a size equal to that of each of the second subpixels, and number of the first subpixels constituting each of the first pixels 1011 is equal to number of the second subpixels constituting each of the second pixels 1012. Adjacent two of the first subpixels are spaced apart at a distance less than a distance between adjacent two of the second subpixels, so that each of the first pixel 1011 has a size equal to a size of each of the second pixel 1012 when the foldable display device 100 is in the fully expanded state, thereby further improving display uniformity of the foldable display device 100.

When the foldable display device 100 is embodied as an outward-folded display device in the pre-folded state, the flexible display panel 101 is correspondingly in the first pre-folded state, and adjacent two of the first pixels 1011 are spaced apart at a distance greater than a distance between adjacent two of the second pixels 1012. When the foldable display device 100 deforms from the pre-folded state to the fully expanded state, part of a display surface of the flexible display panel 101 corresponding to the folding area 100a is subjected to compressive stress, wherein a distance between adjacent two of the first pixels 1011 gradually decreases, and a distance between adjacent two of the second pixels 1012 remains unchanged. When the flexible display panel 101 is in the fully expanded state, a distance between adjacent two of the first pixels 1011 is the same as a distance between adjacent two of the second pixels 1012. Likewise, in order to allow each of the first pixels 1011 to have a size the same as that of the each of the second pixels 1012, number of the first subpixels constituting each of the first pixels 1011 is equal to number of the second subpixels constituting each of the second pixel 1012, wherein each of the first subpixels has a size the same that of each of the second subpixels, and adjacent two of the first subpixels are spaced apart at a distance greater than a distance between adjacent two of the second subpixels, thereby further improving display uniformity of the foldable display device 100.

Figure 7:
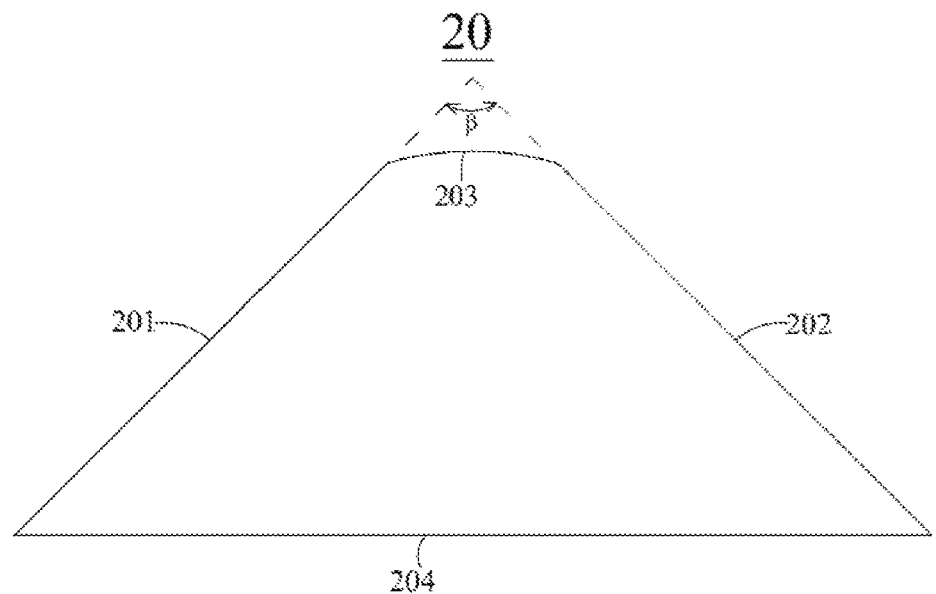
FIG. 7 is a second schematic view of a jig used to manufacture a foldable display device in accordance with an embodiment of the present application.
Figure 8:
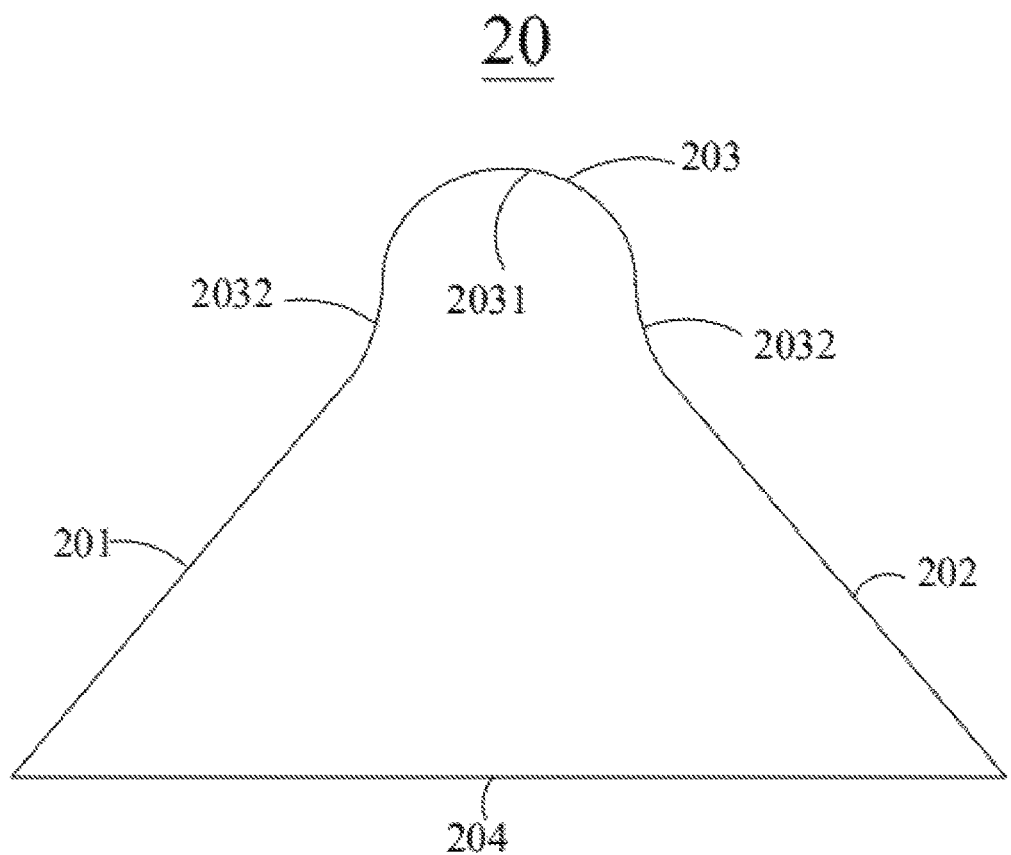
FIG. 8 is a third schematic view of a jig used to manufacture a foldable display device in accordance with an embodiment of the present application.

In addition, when the foldable display device 100 is in the pre-folded sate, the part of the foldable display device 100 corresponding to the folding area 100*a* may have a drip-like curve shape. In doing so, when the flexible display panel 101 is in the first pre-folded state, the part of the flexible display panel 101 corresponding to the folding area 100*a* also has a drip-like curve shape. The drip-like curve shape has an inward-bent curved segment and two outward-bent curved segments connected to two ends of the inward-bent curved segment. Part of the flexible display panel 101 having the outward-bent curved segments are connected between the part of the flexible display panel corresponding to the non-folding areas 100*b* and part of the flexible display panel 101 having the inward-bent curved segment. Such type of the flexible display panel 101 in the first pre-folded state is manufactured by using a jig as shown in FIG. 8. When the flexible display panel 101 deforms from the first pre-folded state to the folded up state, such that the first pre-folded state shows the folding area 100*a* bends outward in a substantially drip-like curve shape, and the folded up state shows the folding area 100*a* bends inward to form a drip-like shape, an angle γ greater than zero degree formed by the part of the flexible display panel 101 corresponding to the two non-folding areas 100*b* located on the opposite two sides of the folding area 100*a* changes to be zero degree, thereby an amount of deformation produced by the flexible display panel 101 becomes less than it was. When the foldable display device is in the pre-folded state, the part of the foldable display device 100 corresponding to the folding area 100*a* may have an oval arc shape. In doing so, the part of the flexible display panel 101 corresponding to the folding area 100*a* in the first pre-folded state may also have an oval arc shape. Such type of the flexible display panel 101 in the first pre-folded state is manufactured by using a jig as shown in FIG. 7.

Please continue referring to FIGS. 1D and 1E. The functional layer 102 is provided in a second pre-folded state. In this embodiment, when the foldable display device 100 is in the pre-folded sate, the functional layer 102 is thus in the second pre-folded state. At this time, part of the functional layer 102 corresponding to the two non-folding areas 100*b* located on the opposite two sides of the folding area 100*a* is disposed with respect to each other at an angle θ equal to the angle α formed by the part of the foldable display device 100 corresponding to the two non-folding areas 100*b* located on the opposite two sides of the folding area 100*a*. When the functional layer 102 is in the second pre-folded state, the part of the functional layer 102 corresponding to the non-folding areas 100*b* located on the opposite two sides of the folding area 100*a* is disposed at an angle θ greater than zero degree and less than 180 degrees with respect to each other. The part of the functional layer 102 corresponding to the folding area 100*a* is under a stress less than or equal to a second predetermined threshold, so that an amount of deformation of the part of the functional layer 102 corresponding to the folding area 100*a* is zero. The second predetermined threshold ranges between 0.8 MPa and 11 MPa.

The functional layer 102 includes at least one of a rear cover, a protection cover, a polarizer, a rigid support layer, and a touch layer. A rear cover is a polyimide layer configured to protect a rear side of a display surface of the flexible display panel 101. The polarizer is a circular polarizer, used to increase transmittance of ambient light when passing through the flexible display panel 101, to avoid the ambient light from affecting display effects of the foldable display device 100. The protection cover includes a transparent polyimide layer and a rigid layer. The rigid layer is disposed on a non-folding area of the transparent polyimide layer. The touch layer includes a flexible substrate and a touch unit disposed on the flexible substrate. The touch unit may be a self-capacitive touch electrode or a mutual-capacity touch electrode. The rigid support layer is made of stainless steel sheet, and the stainless steel sheet has a thickness of 40 microns±5 microns. According to the composition of the rear cover, the protection cover, the polarizer, the rigid support layer, and the touch layer, the second predetermined threshold of each of the functional layers is different. The second predetermined threshold set for the rear cover, the protection cover, and the polarizer is 1 MPa. When the touch layer contains a metal material, the second predetermined threshold of the touch layer is 10 MPa. The second predetermined threshold of the rigid support layer is 10 MPa.

Specifically, the functional layer 102 includes a touch layer 1021, a polarizer 1022, a protection cover 1023, and a rear cover 1024. When the foldable display device is the outward-bent display device, as shown in FIG. 1D, the rear cover 1024, the flexible display panel 101, the touch layer 1021, the polarizer 1022, and the protection layer 1023 are sequentially disposed in a stack arrangement. When the foldable display device is the inward-bent display device, as shown in FIG. 1E, the protection cover 1023, the polarizer 1022, the touch layer 1021, the flexible display panel 101, and the rear cover 1024 are sequentially disposed in a stack arrangement.

When the functional layer 102 is in the second pre-folded state, part of each of the touch layer 1021, the polarizer 1022, the protection layer 1023, and the rear cover 1024 corresponding to the non-folding areas 100*b* located on the opposite two sides of the folding area 100*a* is disposed at angle θ with respect to each other. For easier understanding, in FIGS. 1D and 1E, only the angle θ formed by the part of the touch layer 1021 corresponding to the non-folding areas 100*b* located on the opposite two sides of the same folding area 100*a* is used to illustrate the angle θ formed by the part of the functional layer 102 corresponding to the non-folding areas 100*b* located on the opposite two sides of the same folding area 100*a*.

When the functional layer 102 is the touch layer 1021, the touch layer 1021 includes a plurality of first touch units 10211 corresponding to position of the folding area 100*a*, and a plurality of second touch units 10212 corresponding to position of the non-folding areas 100*b*. When the foldable display device 100 is in the pre-folded state, the touch layer 1021 is correspondingly in the second pre-folded state, and adjacent two of the first touch units 10211 are spaced apart at a distance different from a distance between adjacent two of the second touch units 10212. When the foldable display device 100 is in the fully expanded state, the touch layer 1021 is correspondingly in the fully expanded state, and adjacent two of the first touch units 10211 are spaced apart at a distance equal to a distance between adjacent two of the second touch units 10212.

Figure 3A:
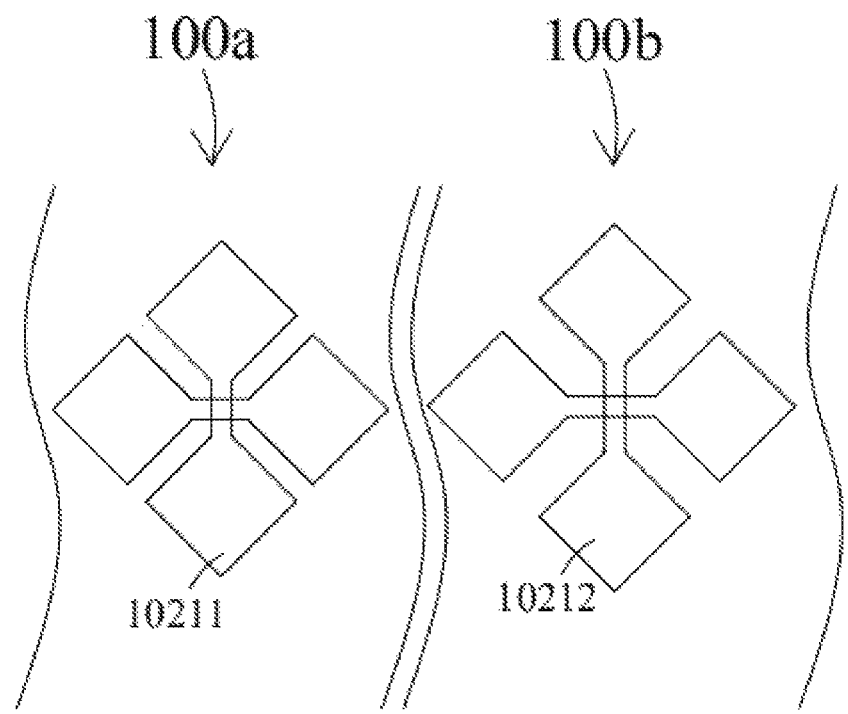
FIG. 3A is a schematic partial view showing a touch layer of a foldable display device, wherein the foldable display device is embodied as an inward-folded display device and the touch layer is in a second pre-folded state.
Figure 3B:
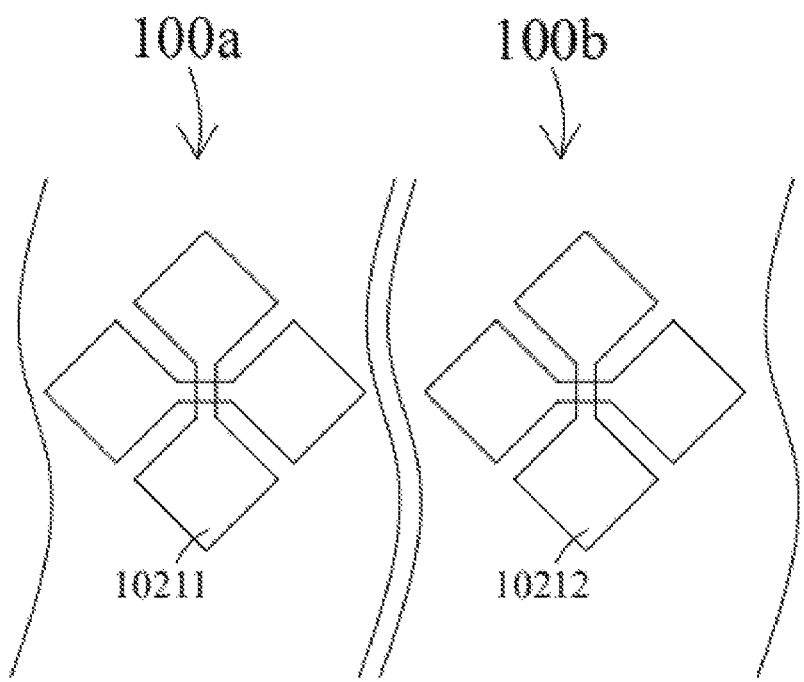
FIG. 3B is a partial schematic view of the touch layer of FIG. 3A in a fully expanded state.

Please refer to FIGS. 3A and 3B. FIG. 3A is a schematic partial view showing a touch layer of a foldable display device, wherein the foldable display device is embodied as an inward-folded display device and the touch layer is in a second pre-folded state. FIG. 3B is a partial schematic view of the touch layer of FIG. 3A in a fully expanded state. Taking the first touch units 10211 and the second touch units 10212 as prism electrodes arranged in an array as well as mutual-capacitive touch electrodes as an example, when the foldable display device 100 is in the pre-folded state, the touch layer 1021 is correspondingly in the second pre-folded state, and adjacent two of the first touch units 10211 are spaced apart at a distance less than a distance between adjacent two of the second touch units 10212. In doing so, when the touch layer 1021 is in the fully expanded state, adjacent two of the first touch units 10211 are spaced apart at a distance equal to a distance between adjacent two of the second touch units 10212, so that touch performance of both the folding area 100a and the non-folding areas 100b of the foldable display device 100 is the same.

As the foldable display device 100 is embodied as an outward-bent display device, the foldable display device 100 is in the pre-folded state, the touch layer 1021 is correspondingly in the second pre-folded state, and adjacent two of the first touch units 10211 are spaced apart at a distance greater than a distance between adjacent two of the second touch units 10212, so that touch performance of both the folding area 100a and the non-folding areas 100b of the foldable display device 100 is the same when the touch layer 1021 is in the fully expanded state.

It should be noted that when the foldable display device is in the pre-folded state, the flexible display panel 101 is in the first pre-folded state, the functional layer 102 is in the second pre-folded state, and the angle γ formed by the part of the flexible display panel 101 corresponding to the non-folding areas 100b located on the opposite two sides of the folding area 100a is the same as the angle θ formed by the part of the functional layer 102 corresponding to the non-folding areas 100b located on the opposite two sides of the same folding area 100a. In other embodiments, when the flexible display panel 101 is in the first pre-folded state, the functional layer 102 is in the second pre-folded state, and an amount of deformation of a bending part of the flexible display panel is zero, the angle γ formed by the part of the flexible display panel 101 corresponding to the non-folding areas 100b located on the opposite two sides of the folding area 100a may not be the same as the angle θ formed by the part of the functional layer 102 corresponding to the non-folding areas 100b located on the opposite two sides of the same folding area 100a.

Figure 4:
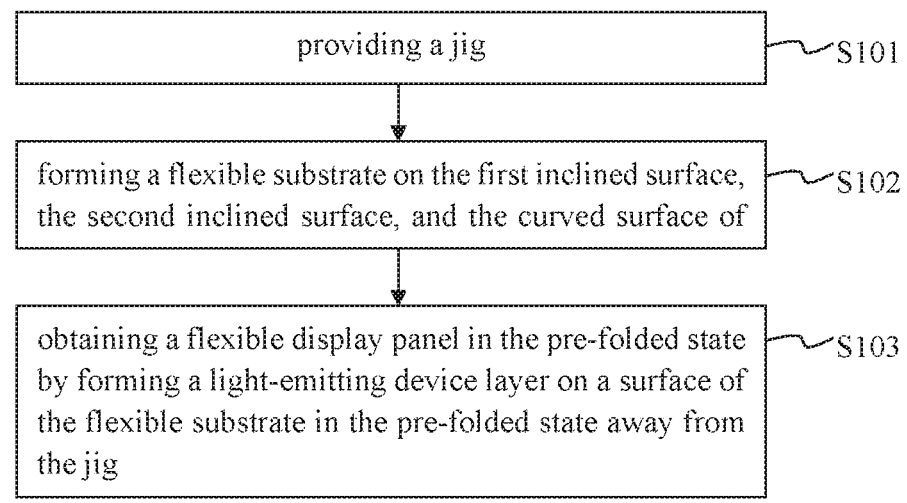
FIG. 4 is a flowchart showing a method of manufacturing a foldable display device in accordance with an embodiment of the present application.

Please refer to FIG. 4 showing a flowchart of a method of manufacturing a foldable display device in accordance with an embodiment of the present application. The method of manufacturing the foldable display device includes following steps:

S101: providing a jig.

Figure 5:
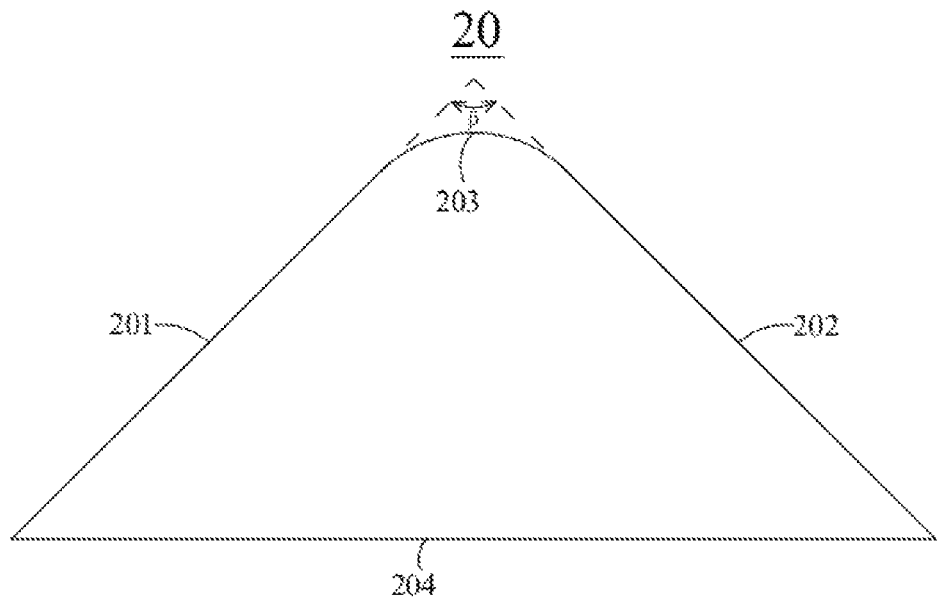
FIG. 5 is a first schematic view of a jig used to manufacture a foldable display device in accordance with an embodiment of the present application.

Please refer to FIG. 5 showing a first schematic view of a jig used to manufacture a foldable display device in accordance with an embodiment of the present application. The jig 20 includes a first inclined surface 201, a second inclined surface 202, and a curved surface 203 connecting the first inclined surface 201 and the second inclined surface 202. The first inclined surface 201 and the second inclined surface 202 are disposed at an angle β greater than zero degree and less than 180 degrees with respect to each other. The curved surface 203 is curved in an arc shape. The jig 20 further includes a bottom surface 204, wherein the bottom surface 204 is connected to the first inclined surface 201 and the second inclined surface 202. The jig is made of a rigid material, for example, a material of the jig is glass.

S102: forming a flexible substrate 1013 on the first inclined surface 201, the second inclined surface 202, and the curved surface 203 of the jig 20.

Figure 6A:
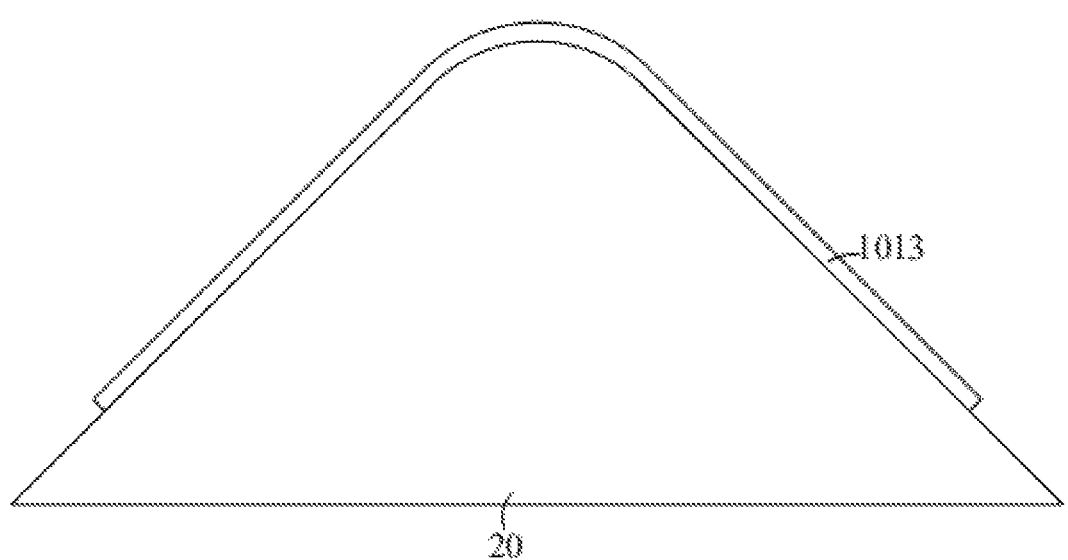
FIGS. 6A and 6B are schematic view showing processes of manufacturing a foldable display device in accordance with an embodiment of the present application.

Specifically, by coating polyamic acid solution on the first inclined plane 201, the second inclined plane 202, and the curved surface 203, and heating in an inert atmosphere, a flexible substrate 1013 in a pre-folded state is obtained, as shown in FIG. 6A. Since the flexible substrate being manufactured is in the pre-folded state as its initial state, a bending portion of the flexible substrate 1013 is in a naturally unstressed state, such that an amount of deformation of the bending portion of the flexible substrate 1013 is zero.

S103: obtaining a flexible display panel 101 in the pre-folded state by forming a light-emitting device layer 1014 on a surface of the flexible substrate 1013 in the pre-folded state away from the jig 20.

Figure 6B:
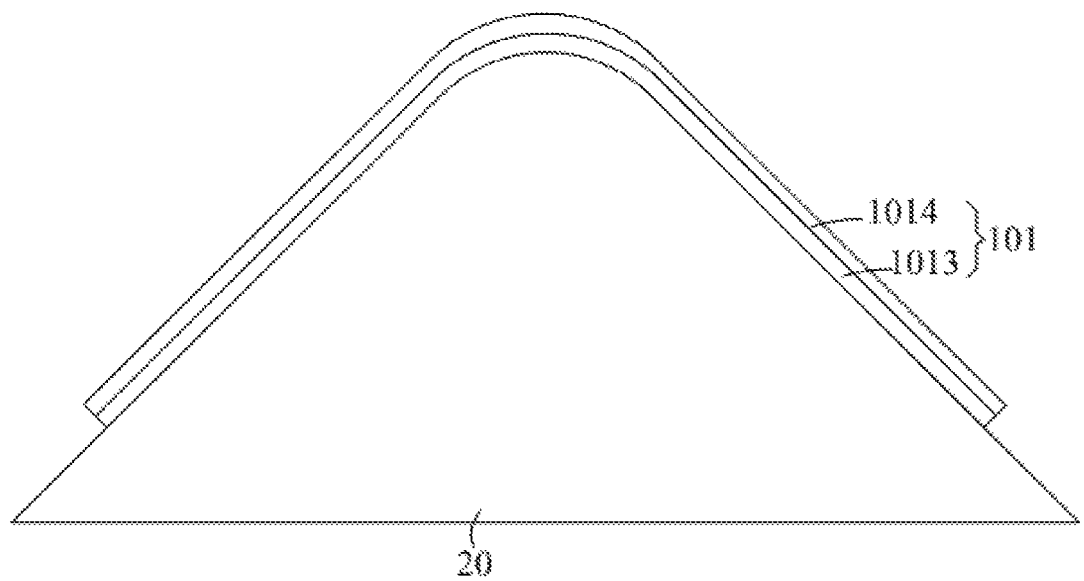

Specifically, a plurality of independent anodes are formed on the surface of the flexible substrate 1013 in the pre-folded state away from the jig 20 through a sputter deposition process and a yellow light process. Use vacuum evaporation or inkjet printing to form an organic light-emitting layer on the independent anodes. Use sputter deposition or vacuum evaporation to form a cathode on the organic light-emitting layer. An encapsulation layer covering the cathode is formed through processes such as chemical vapor deposition and coating, so that the flexible display panel 101 in the pre-folded state is obtained, as shown in FIG. 6B. At this time, the flexible display panel 101 in the pre-folded state is in a naturally unstressed state, such that an amount of deformation of the bending portion of the flexible display panel 101 in the pre-folded state is zero.

When the light-emitting device layer 1014 is composed of a plurality of top-emission organic light-emitting diodes arranged in an array, a surface of the light-emitting device layer 1014 away from the flexible substrate 1013 is a light output surface. The flexible display panel 101 in the pre-folded state configured with the light-emitting device layer 1014 and the flexible substrate 1013 can be applied to an outward-folded display device. When the light-emitting device layer 1014 is composed of a plurality of bottom-emission organic light-emitting diodes arranged in an array, a surface of the light-emitting device layer 1014 adjacent to the flexible substrate 1013 is a light output surface. The flexible display panel 101 in the pre-folded state configured with the light-emitting device layer 1014 and the flexible substrate 1013 can be applied to an inward-folded display device.

Before the light-emitting device layer 1014 is formed on the surface of the flexible substrate 1013 in the pre-folded state away from the jig 20, a thin-film transistor array layer may be prepared by chemical deposition, physical deposition, and yellow light process.

The bending portion of the flexible display panel 101 in the pre-folded state prepared by using the jig 20 is under a stress less than or equal to a first predetermined threshold, thereby enabling a zero amount of deformation of the bending portion of the flexible display panel 101. The first predetermined threshold ranges between 8 MPa and 12 MPa. Specifically, the first predetermined threshold is 10 Mpa.

In this embodiment, the method of manufacturing the foldable display device 100 further includes following steps: forming a functional layer in a pre-folded state on the first inclined surface 201, the second inclined surface 202, and the curved surface 203 of the jig 20. The functional layer in the pre-folded state includes a bending portion under a stress less than or equal to a second predetermined threshold, thereby enabling a zero amount of deformation of the bending portion of the functional layer in the pre-folded state. The second predetermined threshold ranges between 0.8 MPa and 11 MPa. The functional layer includes at least one of a rear cover, a protection cover, a polarizer, a rigid support layer, and a touch layer.

It should be noted that in this embodiment an angle β is formed by the jig 20 for preparing the flexible display panel 101 and is the same as an angle β formed by a jig for preparing the functional layer. In another embodiment, an angle β formed by a jig for preparing a flexible display panel may not be the same as an angle β formed by a jig for preparing the functional layer. In this manner, an angle formed by part of the flexible display panel corresponding to the non-folding areas located on the opposite two sides of the folding area is not the same as an angle formed by part of the functional layer corresponding to the non-folding areas located on the opposite two sides of the folding area when the functional layer is in a state of a zero amount of deformation.

In this embodiment, an angle β formed by the first inclined surface 201 and the second inclined surface 202 is greater than or equal to 10 degrees and less than or equal to 170 degrees, for example, the angle β is 10 degrees, 30 degrees, 150 degrees, or 170 degrees. In doing so, after the flexible display panel 101 in the pre-folded state and the functional layer in the pre-folded state are manufactured by the jig 20, a maximum deformation amount of the flexible display panel 101 and the functional layer 102 becomes less when the foldable display device 100 deforms from the pre-folded state to other states, thereby reducing a risk of breakage in bending the flexible display panel 101 and the functional layer 102.

Furthermore, an angle β formed by the first inclined surface 201 and the second inclined surface 202 is greater than or equal to 60 degrees and less than or equal to 120 degrees, for example, the angle β is 60 degrees, 70 degrees, 80 degrees, 100 degrees, 110 degrees, or 120 degrees. In doing so, after the flexible display panel 101 in the pre-folded state and the functional layer in the pre-folded state are manufactured by the jig 20, a maximum deformation amount of the flexible display panel 101 and the functional layer 102 becomes less when the foldable display device 100 deforms from the pre-folded state to other states, thereby reducing a risk of breakage in bending the flexible display panel 101 and the functional layer 102.

Still further, an angle β formed by the first inclined surface 201 and the second inclined surface 202 is equal to 90 degrees. In doing so, after the flexible display panel 101 in the pre-folded state and the functional layer in the pre-folded state are manufactured by the jig 20, a maximum deformation amount of the flexible display panel 101 and the functional layer 102 is further reduced when the foldable display device 100 deforms from the pre-folded state to other states, thereby further reducing a risk of breakage in bending the flexible display panel 101 and the functional layer 102.

Please refer to FIG. 7 showing a second schematic view of a jig used to manufacture a foldable display device in accordance with an embodiment of the present application. The jig shown in FIG. 7 is basically similar to the jig shown in FIG. 5 except that the curved surface 203 is curved in an oval arc shape. The bending portion of the flexible display panel in the pre-folded state and the bending portion of the functional layer in the pre-folded state made with the jig shown in FIG. 7 are all curved in an oval arc shape.

Please refer to FIG. 8 showing a third schematic view of a jig used to manufacture a foldable display device in accordance with an embodiment of the present application. The jig shown in FIG. 8 is basically similar to the jig shown in FIG. 5 except that the curved surface 203 has a substantially drip-like curve shape. The drip-like curve shape has an inward-bent curved segment 2031 and two outward-bent curved segments 2032 connected to two ends of the inward-bent curved segment 2031, wherein portions of the curved surface 203 corresponding to the outward-bent curved segments 2032 are connected to the first inclined surface 201 and the second inclined surface 202. The bending portion of the flexible display panel 101 in the pre-folded state and the bending portion of the functional layer 102 in the pre-folded state made with the jig shown in FIG. 8 are all curved in the drip-like curve shape.

Figure 9:
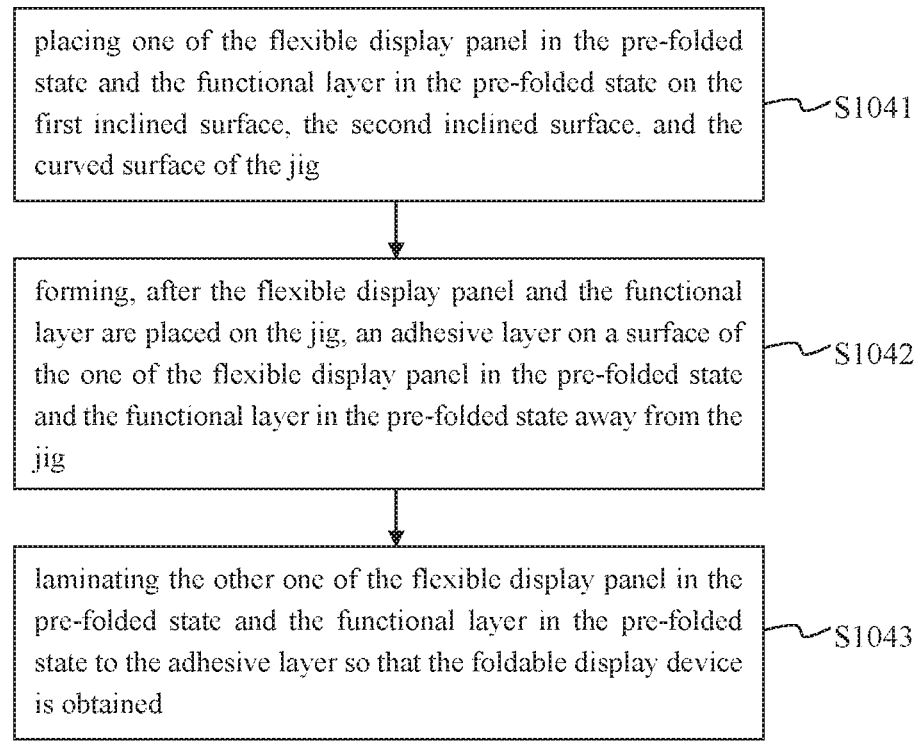
FIG. 9 is a flowchart showing how a flexible display panel in a pre-folded state and a functional layer in a pre-folded state are laminated together through a jig.

Please refer to FIG. 9 showing a flowchart of how a flexible display panel in a pre-folded state and a functional layer in a pre-folded state are laminated together through a jig. A method of laminating the flexible display panel in the pre-folded state with the functional layer in the pre-folded state includes following steps:

S1041: placing one of the flexible display panel in the pre-folded state and the functional layer in the pre-folded state on the first inclined surface 201, the second inclined surface 202, and the curved surface 203 of the jig.

Figure 10A:
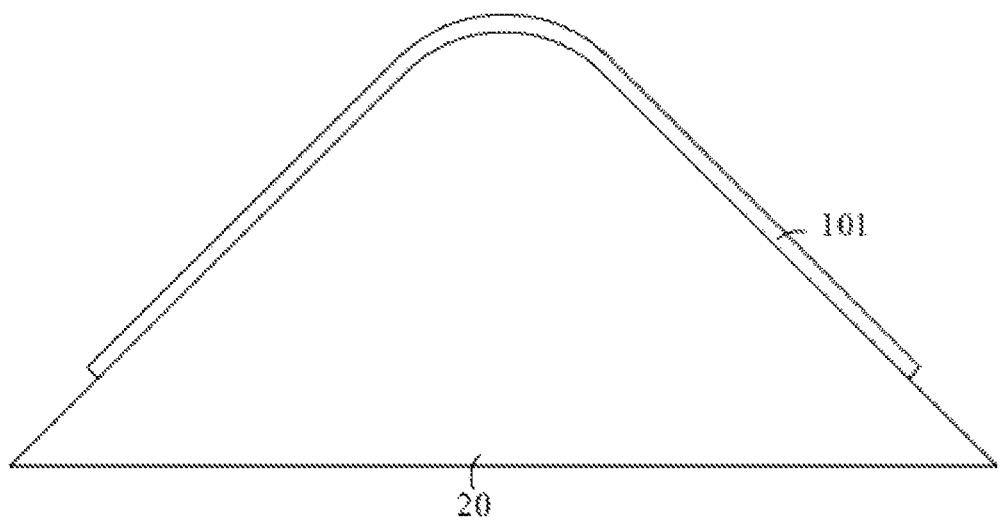
FIGS. 10A, 10B and 10C are schematic views showing processes of laminating a flexible display panel in a pre-folded state to a functional layer in a pre-folded state.

Specifically, the flexible display panel 101 in the pre-folded state obtained in step S103 is placed on the first inclined surface 201, the second inclined surface 202, and the curved surface 203 of the jig, as shown in FIG. 10A.

S1042: forming, after the flexible display panel and the functional layer are placed on the jig, an adhesive layer on a surface of the one of the flexible display panel in the pre-folded state and the functional layer in the pre-folded state away from the jig.

Figure 10B:
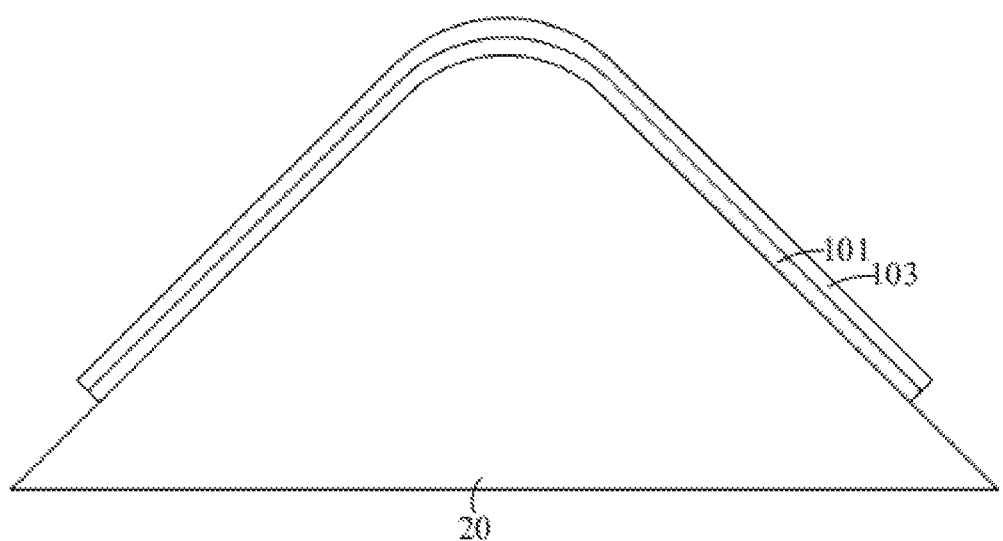

Specifically, an adhesive layer 103 is formed by applying an optically clear adhesive on a surface of the flexible display panel 101 away from the jig 20, as shown in FIG. 10B.

S1043: laminating the other one of the flexible display panel in the pre-folded state and the functional layer in the pre-folded state to the adhesive layer so that the foldable display device is obtained.

Figure 10C:
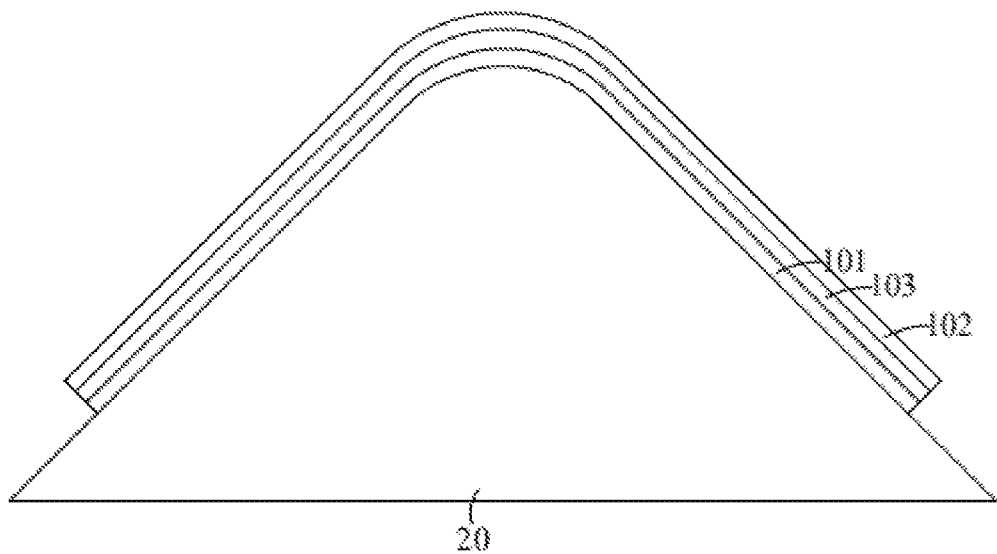

Specifically, the functional layer 102 in the pre-folded state is laminated to a surface of the adhesive layer 103 away from the flexible display panel 101 in the pre-folded state, so that the foldable display device is obtained, as shown in FIG. 10C. The functional layer in the pre-folded state in this step and the flexible display panel in the pre-folded state in step S1041 are manufactured using the same jig.

Since the adhesive layer 103 is coated on the flexible display panel 101 in the pre-folded state, the adhesive layer 103 that bonds the flexible display panel 101 in the pre-folded state and the functional layer 102 in the pre-folded state is also naturally unstressed in the pre-folded state, as well as a zero amount of deformation. In this manner, a maximum deformation amount of the adhesive layer 103 is less than an amount of deformation in the prior art when the foldable display device deforms from the pre-folded state to the fully expanded state or the folded up state.

Figure 11:
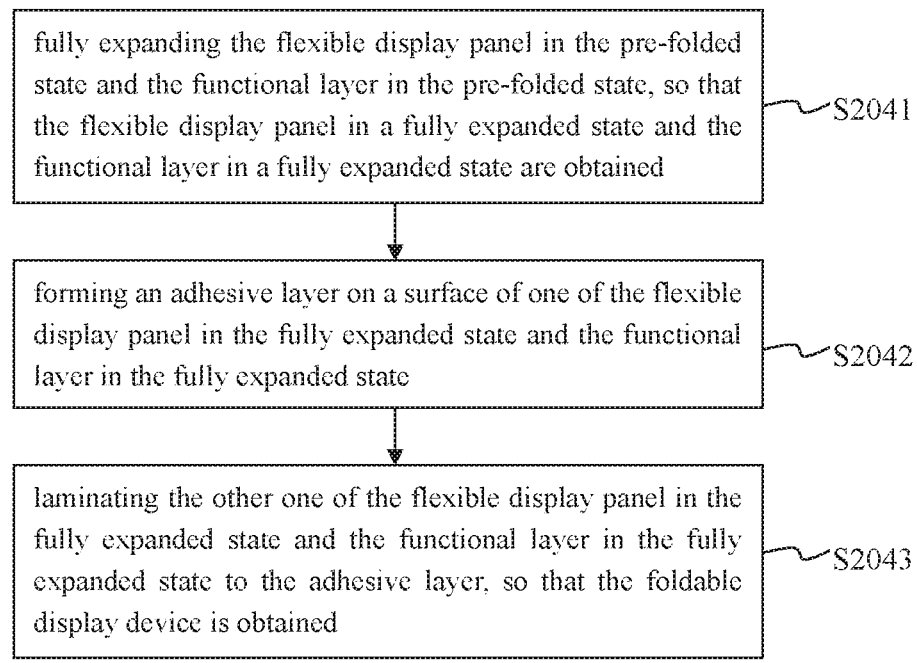
FIG. 11 is a flowchart showing how a flexible display panel in a pre-folded state and a functional layer in a pre-folded state are laminated together after they are fully expanded.

Please refer to FIG. 11 showing a flowchart of how a flexible display panel in a pre-folded state and a functional layer in a pre-folded state are laminated together after they are fully expanded. A method of laminating the flexible display panel in the pre-folded state and the functional layer in a pre-folded state together after they are fully expanded includes following steps:

S2041: fully expanding the flexible display panel in the pre-folded state and the functional layer in the pre-folded state, so that the flexible display panel in a fully expanded state and the functional layer in a fully expanded state are obtained.

Figure 12A:
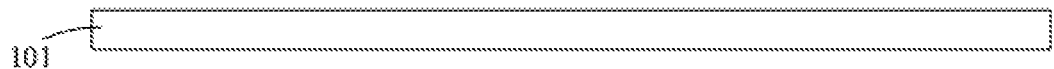
FIGS. 12A, 12B and 12C are schematic views showing processes of laminating a flexible display panel in a pre-folded state to a functional layer in a pre-folded state after they are fully expanded.

Specifically, the flexible display panel in the pre-folded state and the functional layer in the pre-folded state are fully expanded by bending outward, so that the flexible display panel 101 in the fully expanded state and the functional layer in the fully expanded state are obtained, as shown in FIG. 12A.

S2042: forming an adhesive layer on a surface of one of the flexible display panel in the fully expanded state and the functional layer in the fully expanded state.

Figure 12B:
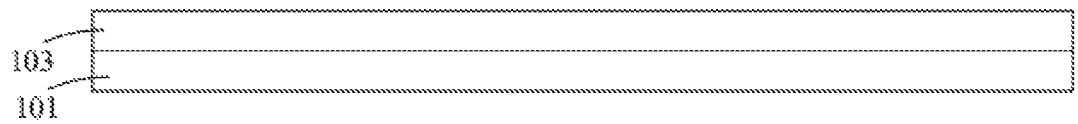

Specifically, a surface of the flexible display panel 101 in the fully expanded state is coated with optically clear adhesive to form an adhesive layer 103, as shown in FIG. 12B.

S2043: laminating the other one of the flexible display panel in the fully expanded state and the functional layer in the fully expanded state to the adhesive layer, so that the foldable display device is obtained.

Figure 12C:
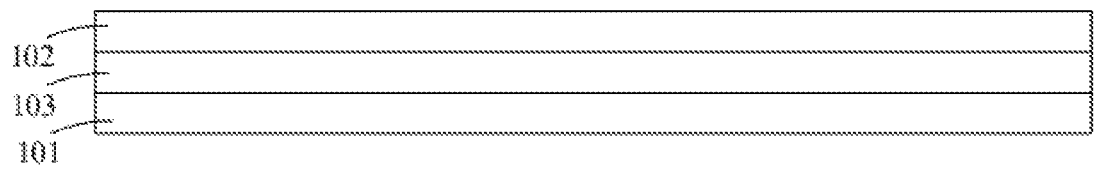

Specifically, the functional layer 102 in the fully expanded state is laminated to a surface of the adhesive layer 103 away from the flexible display panel, so that the foldable display device in the fully expanded state is obtained, as shown in FIG. 12C.

Since the adhesive layer 103 is formed on the surface of the flexible display panel 101 in the fully expanded state, the adhesive layer 103 is naturally unstressed in the fully expanded state. Compared with the adhesive layer 103 formed in the above steps S1041 to S1043, a maximum deformation amount of the adhesive layer 103 formed during steps S2042 to S2043 in folding will be greater. A maximum deformation amount of the flexible display panel 101 and the functional layer 102 formed in steps S1041 to S1043 and steps S2042 to S2043 during folding is less than that of the prior art, thereby preventing the flexible display panel 101 and the functional layer 103 from breaking during folding.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A foldable display device, comprising:
    at least a folding area and a plurality of non-folding areas disposed on and adjoining opposite two sides of the at least a folding area;
    a flexible display panel provided in a first pre-folded state, wherein when the flexible display panel is in the first pre-folded state, part of the flexible display panel corresponding to the folding area is under a stress less than or equal to a first predetermined threshold ranging between 8 megapascals (MPa) and 12 MPa, wherein part of the flexible display panel corresponding to the non-folding areas located on the opposite two sides of the folding area is disposed at an angle greater than zero degrees and less than 180 degrees with respect to each other.

2. The foldable display device of claim 1, wherein when the flexible display panel is in the first pre-folded state, the part of the flexible display panel corresponding to the folding area is under the stress equal to 0 MPa.

3. The foldable display device of claim 1, wherein when the flexible display panel is in the first pre-folded state, the part of the flexible display panel corresponding to the non-folding areas located on the opposite two sides of the folding area is disposed at an angle greater than or equal to 10 degrees and less than or equal to 170 degrees with respect to each other.

4. The foldable display device of claim 1, wherein when the flexible display panel is in the first pre-folded state, the part of the flexible display panel corresponding to the non-folding areas located on the opposite two sides of the folding area is disposed at an angle greater than or equal to 60 degrees and less than or equal to 120 degrees with respect to each other.

5. The foldable display device of claim 4, wherein when the flexible display panel is in the first pre-folded state, the part of the flexible display panel corresponding to the non-folding areas located on the opposite two sides of the folding area is disposed at an angle equal to 90 degrees with respect to each other.

6. The foldable display device of claim 1, further comprising a functional layer, wherein the functional layer is provided in a second pre-folded state, and when the functional layer is in the second pre-folded state, part of the functional layer corresponding to the non-folding areas located on the opposite two sides of the folding area is disposed at an angle greater than zero degrees and less than 180 degrees with respect to each other, wherein the part of the functional layer corresponding to the folding area is under a stress less than or equal to a second predetermined threshold.

7. The foldable display device of claim 6, wherein the second predetermined threshold ranges between 0.8 MPa and 11 MPa, and the functional layer comprises at least one of a rear cover, a protection cover, a polarizer, a rigid support layer, and a touch layer.

8. The foldable display device of claim 6, wherein the functional layer is a touch layer, and the touch layer comprises a plurality of first touch units corresponding to position of the folding area, and a plurality of second touch units corresponding to position of the non-folding areas;
    wherein when the touch layer is in the second pre-folded state, adjacent two of the first touch units are spaced apart at a distance different from a distance between adjacent two of the second touch units;
    wherein when the touch layer is in a fully expanded state, adjacent two of the first touch units are spaced apart at a distance equal to a distance between adjacent two of the second touch units.

9. The foldable display device of claim 1, wherein when the flexible display panel is in the first pre-folded state, the part of the flexible display panel corresponding to the folding area has a circular arc shape or an oval arc shape, or when the flexible display panel is in the first pre-folded state, the part of the flexible display panel corresponding to the folding area has a drip-like curve shape, wherein the drip-like curve shape has an inward-bent curved segment and two outward-bent curved segments connected to two ends of the inward-bent curved segment, wherein part of the flexible display panel having the outward-bent curved segments are connected between the part of the flexible display panel corresponding to the non-folding areas and part of the flexible display panel having the inward-bent curved segment.

10. A method of manufacturing a foldable display device, comprising:
provoking a jig, the jig comprising a first inclined surface, a second inclined surface, and a curved surface connecting the first inclined surface and the second inclined surface, wherein the first inclined surface and the second inclined surface are disposed at an angle greater than zero degrees and less than 180 degrees with respect to each other;
forming a flexible substrate on the first inclined surface, the second inclined surface, and the curved surface of the jig, such that the flexible substrate is in a pre-folded state;
obtaining, by forming a light-emitting device layer on a surface of the flexible substrate in the pre-folded state away from the jig, a flexible display panel in the pre-folded state; and
forming a functional layer in the pre-folded state on the first inclined surface, the second inclined surface, and the curved surface of the jig;
wherein the flexible display panel in the pre-folded state comprises a bending portion under a stress less than or equal to a first predetermined threshold, and the functional layer in the pre-folded state comprises a bending portion under a stress less than or equal to a second predetermined threshold.

11. The method of manufacturing the foldable display device of claim 10, further comprising:
placing one of the flexible display panel in the pre-folded state or the functional layer in the pre-folded state on the first inclined surface, the second inclined surface, and the curved surface of the jig;
forming an adhesive layer away from the jig on a surface of the flexible display panel in the pre-folded state or on a surface of the functional layer in the pre-folded state whichever is placed on the jig; and
laminating one of the flexible display panel in the pre-folded state or the functional layer in the pre-folded state whichever is not placed on the jig to the adhesive layer so that the foldable display device is obtained.

12. The method of manufacturing the foldable display device of claim 10, further comprising:
fully expanding the flexible display panel in the pre-folded state and the functional layer in the pre-folded state, so that the flexible display panel in a fully expanded state and the functional layer in a fully expanded state are obtained;
forming an adhesive layer on a surface of one of the flexible display panel in the fully expanded state or the functional layer in the fully expanded state; and
laminating one of the flexible display panel in the fully expanded state or the functional layer in the fully expanded state whichever is in exclusion of the adhesive layer to the adhesive layer, so that the foldable display device in the fully expanded state is obtained.

13. The method of manufacturing the foldable display device of claim 10, wherein the functional layer comprises at least one of a rear cover, a protection cover, a polarizer, a rigid support layer, and a touch layer.

14. The method of manufacturing the foldable display device of claim 10, wherein the first predetermined threshold ranges between 8 MPa and 12 MPa, and the second predetermined threshold ranges between 0.8 MPa and 11 MPa.

15. The method of manufacturing the foldable display device of claim 10, wherein the angle formed by the first inclined surface and the second inclined surface is equal to 90 degrees, and the bending portion of the flexible display panel in the pre-folded state is under the stress equal to 0 Mpa.

16. A foldable display device, comprising:
at least a folding area and a plurality of non-folding areas disposed on and adjoining opposite two sides of the at least a folding area; and
a flexible display panel provided in a first pre-folded state, wherein when the flexible display panel is in the first pre-folded state, part of the flexible display panel corresponding to the folding area is under a stress less than or equal to a first predetermined threshold, wherein part of the flexible display panel corresponding to the non-folding areas located on the opposite two sides of the folding area is disposed at an angle greater than zero degrees and less than 180 degrees with respect to each other;
wherein the flexible display panel comprises a plurality of first pixels disposed corresponding to position of the folding area, and a plurality of second pixels disposed corresponding to position of the non-folding areas;
wherein when the flexible display panel is in the first pre-folded state, adjacent two of the first pixels are spaced apart at a distance different from a distance between adjacent two of the second pixels, and when the flexible display panel is in a fully expanded state, adjacent two of the first pixels are spaced apart at a distance equal to a distance between adjacent two of the second pixels.

17. The foldable display device of claim 16, wherein the foldable display device is an inward-folded display device, and when the flexible display panel is in the first pre-folded state, adjacent two of the first pixels are spaced apart at a distance less than a distance between adjacent two of the second pixels.

18. The foldable display device of claim 16, wherein the foldable display device is an outward-folded display device, and when the flexible display panel is in the first pre-folded state, adjacent two of the first pixels are spaced apart at a distance greater than a distance between adjacent two of the second pixels.

* * * * *